US 10,716,237 B2

(12) United States Patent
Kim et al.

(10) Patent No.: US 10,716,237 B2
(45) Date of Patent: Jul. 14, 2020

(54) DEVICE FOR DRIVING MOTOR

(71) Applicant: LSIS CO., LTD., Anyang-si, Gyeonggi-do (KR)

(72) Inventors: Dong-Sik Kim, Anyang-si (KR); Chun-Suk Yang, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/257,704

(22) Filed: Jan. 25, 2019

(65) Prior Publication Data
US 2019/0239382 A1    Aug. 1, 2019

(30) Foreign Application Priority Data

Jan. 29, 2018    (KR) .................. 10-2018-0010360

(51) Int. Cl.
*H05K 7/20* (2006.01)
*H05K 7/14* (2006.01)

(52) U.S. Cl.
CPC ....... *H05K 7/20154* (2013.01); *H05K 7/1427* (2013.01); *H05K 7/1432* (2013.01); *H05K 7/20909* (2013.01); *H05K 7/20918* (2013.01)

(58) Field of Classification Search
CPC .................. H05K 7/20909–20918
See application file for complete search history.

(56) References Cited

U.S. PATENT DOCUMENTS

| 7,626,818 | B2* | 12/2009 | Yoshida | H05K 7/20909 361/679.48 |
| 7,643,304 | B2* | 1/2010 | Hirota | H02M 1/44 361/601 |
| 9,301,434 | B2* | 3/2016 | Kuwano | H02M 7/003 |
| 9,929,669 | B2* | 3/2018 | Lim | H02M 7/003 |
| 10,039,215 | B2* | 7/2018 | Kubo | H05K 7/1427 |
| 10,219,416 | B2* | 2/2019 | Ono | H01R 9/2416 |
| 2010/0247301 | A1* | 9/2010 | Hatozaki | H02M 7/003 415/182.1 |
| 2014/0160822 | A1 | 6/2014 | Kuwano et al. | |
| 2016/0352242 | A1 | 12/2016 | Takabayashi | |
| 2017/0150654 | A1* | 5/2017 | Kubo | H02M 7/003 |

FOREIGN PATENT DOCUMENTS

| CN | 105873420 A | * | 8/2016 |
| EP | 1531545 A2 | | 5/2005 |
| EP | 3211979 A1 | | 8/2017 |
| JP | 03002682 U | | 1/1991 |
| JP | H06303779 A | | 10/1994 |

(Continued)

OTHER PUBLICATIONS

European Search Report for related European Application No. 19153825.5; action dated Jun. 12, 2019; (21 pages).

*Primary Examiner* — Robert J Hoffberg
(74) *Attorney, Agent, or Firm* — K&L Gates LLP

(57) ABSTRACT

The present invention relates to a device for driving a motor, the device comprising: a main housing for accommodating a circuit module therein, wherein a top of the main housing is partially opened to define an open portion; an input/output (IO) cover coupled to the main housing so as to occupy the open portion; and an auxiliary housing coupled to the main housing at an vertical side face of the main housing.

8 Claims, 6 Drawing Sheets

(56) References Cited

FOREIGN PATENT DOCUMENTS

| JP | H1141951 A | 2/1999 | |
|---|---|---|---|
| JP | 2000195685 A | 7/2000 | |
| JP | 2000232288 A | 8/2000 | |
| JP | 2005151675 A | 6/2005 | |
| JP | 2010119267 A | 5/2010 | |
| JP | 2013055807 A | 3/2013 | |
| WO | WO-2016002016 A1 * | 1/2016 | ......... H05K 7/20918 |

* cited by examiner

PRIOR ART

PRIOR ART

DEVICE FOR DRIVING MOTOR

CROSS-REFERENCE TO RELATED APPLICATION

Pursuant to 35 U.S.C. § 119(a), this application claims the benefit of earlier filing date and right of priority to Korean Application No. 10-2018-0010360, filed on Jan. 29, 2018, in the Korean Intellectual Property Office, the disclosure of which is incorporated herein in its entirety by reference.

TECHNICAL FIELD

The present disclosure relates to a device for driving a motor with an improved structure.

BACKGROUND

Generally, a device for driving a motor refers to a device capable of controlling a speed of the motor with a high efficiency by supplying power supplied from an external power source to the motor via varying a voltage and frequency thereof.

FIG. 1 is a perspective view of a conventional device for driving a motor. FIG. 2 shows a state in which an input/output (IO) cover is removed in FIG. 1.

Referring to FIGS. 1 and 2, a conventional device 1 for driving a motor may be constructed such that a heat sink 12 is disposed under a middle base 11 so as to be exposed, and a circuit module not shown is disposed above the middle base 11, and a main housing 13 accommodates the circuit module.

In this connection, above the main housing 13, an IO cover 14 for opening and closing the 10 circuit module may be disposed.

Further, an auxiliary housing 15 may be disposed on one side face of the main housing 13 adjacent to the IO cover 14. Wires or the like from an outside may be accommodated in the auxiliary housing 15.

The auxiliary housing 15 may be fastened to a top of the heat sink 12 via a first screw coupling 15a. The IO cover 14 may be fastened to a fastening bracket 16 disposed on one side face of the auxiliary housing 15 via a second screw coupling 16a.

The conventional device 1 for driving a motor having such a structure may have following problems.

First, the auxiliary housing 15 must be fastened to a metal part such as the heat sink 12. Thus, a separate structure defining the fastening structure made of the metal material is required. Thus, there is a problem that a product cost increases and an assembling time increases.

Second, since the heat sink 12 should not be miniaturized for coupling the auxiliary housing 15 thereto as described above, miniaturization and lightening of an overall product may not be achieved.

Thirdly, the auxiliary housing 15 is fixed to the device 1 for driving the motor while is coupled via the first screw-coupling 15a only to the heat sink 12. Such a structure may be vulnerable to a load of the wiring or other objects accommodated in the auxiliary housing 15. That is, although the auxiliary housing 15 is comparatively robust relative to a vertical load, the auxiliary housing 15 is vulnerable to a horizontal load, particularly, to a shearing stress, thereby being damaged.

SUMMARY

A technical purpose to be achieved by the present disclosure is to provide a device for driving a motor having an improved coupling structure between the main housing and the auxiliary housing such that a part machining cost is reduced, a manufacturing time is shortened to reduce a product price, and the auxiliary housing is robustly maintained.

In one aspect of the present disclosure, there is provided a device for driving a motor, the device comprising: a main housing for accommodating a circuit module therein, wherein a top of the main housing is partially opened to define an open portion; an input/output (IO) cover coupled to the main housing so as to occupy the open portion; and an auxiliary housing coupled to the main housing at an vertical side face of the main housing.

In one implementation, the main housing further accommodates a heat sink therein.

In one implementation, the main housing has a coupling groove defined in a lower end of another vertical side face of the main housing, wherein the coupling groove is coupled with a hook of the heat sink, wherein the main housing has a plurality of vent holes defined in a vertical side face of the main housing for inflow and outflow of air therethrough.

In one implementation, at least one first coupling hole is defined in the vertical side face of the main housing, wherein the auxiliary housing has at least one second coupling hole a defined at a position corresponding to a position of the at least one first coupling hole.

In one implementation, the main housing has a strength-enhancing vertical groove upwardly opened and defined in the vertical side face portion, wherein the main housing further includes a strength-enhancing piece of a shape corresponding to a shape of the strength-enhancing groove, wherein the strength-enhancing piece has at least one third coupling hole defined in a position thereof corresponding to a position of the at least one first coupling hole.

In one implementation, the auxiliary housing includes: a side face portion engaging with the vertical side face of the main housing; a pair of brackets extending from both lateral ends of the side face portion respectively in a perpendicular manner to the side face portion; and bottom portions connected to bottom ends of the pair of brackets respectively, wherein each of the bottom portions has at least one fourth coupling hole a defined therein.

In one implementation, the auxiliary housing further include an auxiliary cap structure coupled to the pair of brackets.

In one implementation, the auxiliary cap structure includes: a horizontal cap facing away the bottom portions and coupled to a top of the auxiliary housing; and a vertical cap facing away the side face portion and coupled to the pair of brackets.

In one implementation, each of the brackets includes: an inwardly bent horizontal portion to be coupled to the horizontal cap; and an inwardly bent vertical portion to be coupled to the vertical cap.

In one implementation, the main housing accommodates therein a terminal slot block under the open portion of the main housing, wherein one end of a ground wire is connected to the terminal slot block and the other end thereof is connected to the auxiliary housing.

A technical effect of the present disclosure may include followings but may not be limited thereto:

According to the present disclosure, the durability of the product is improved because the auxiliary housing is firmly coupled to the main housing structurally reinforced, or a bottom of the auxiliary housing is structurally reinforced.

Further, the present disclosure may reduce a size of the heat sink because the auxiliary housing is fastened to the main housing. As a result, this may reduce a weight and size of the product and reduce a cost thereof.

DETAILED DESCRIPTIONS

Figure 1:
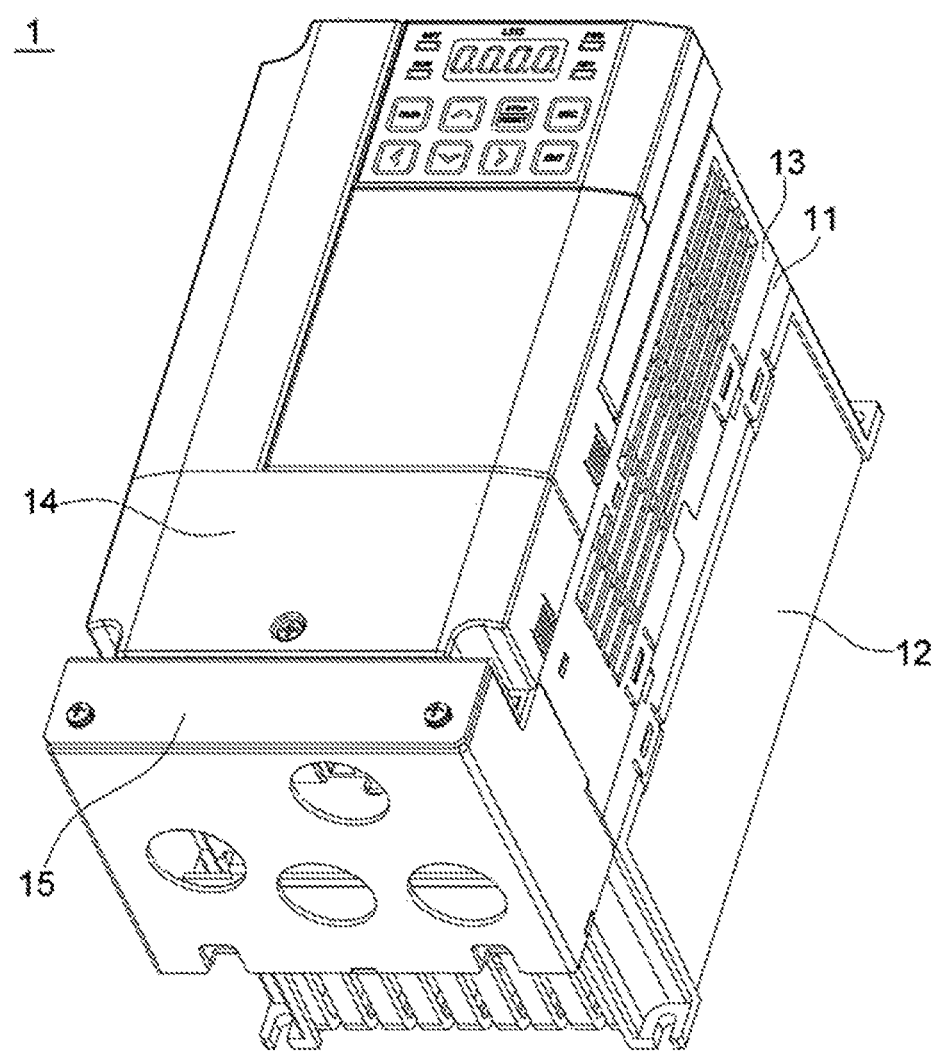
FIG. 1 is a perspective view of a conventional device for driving a motor.
Figure 2:
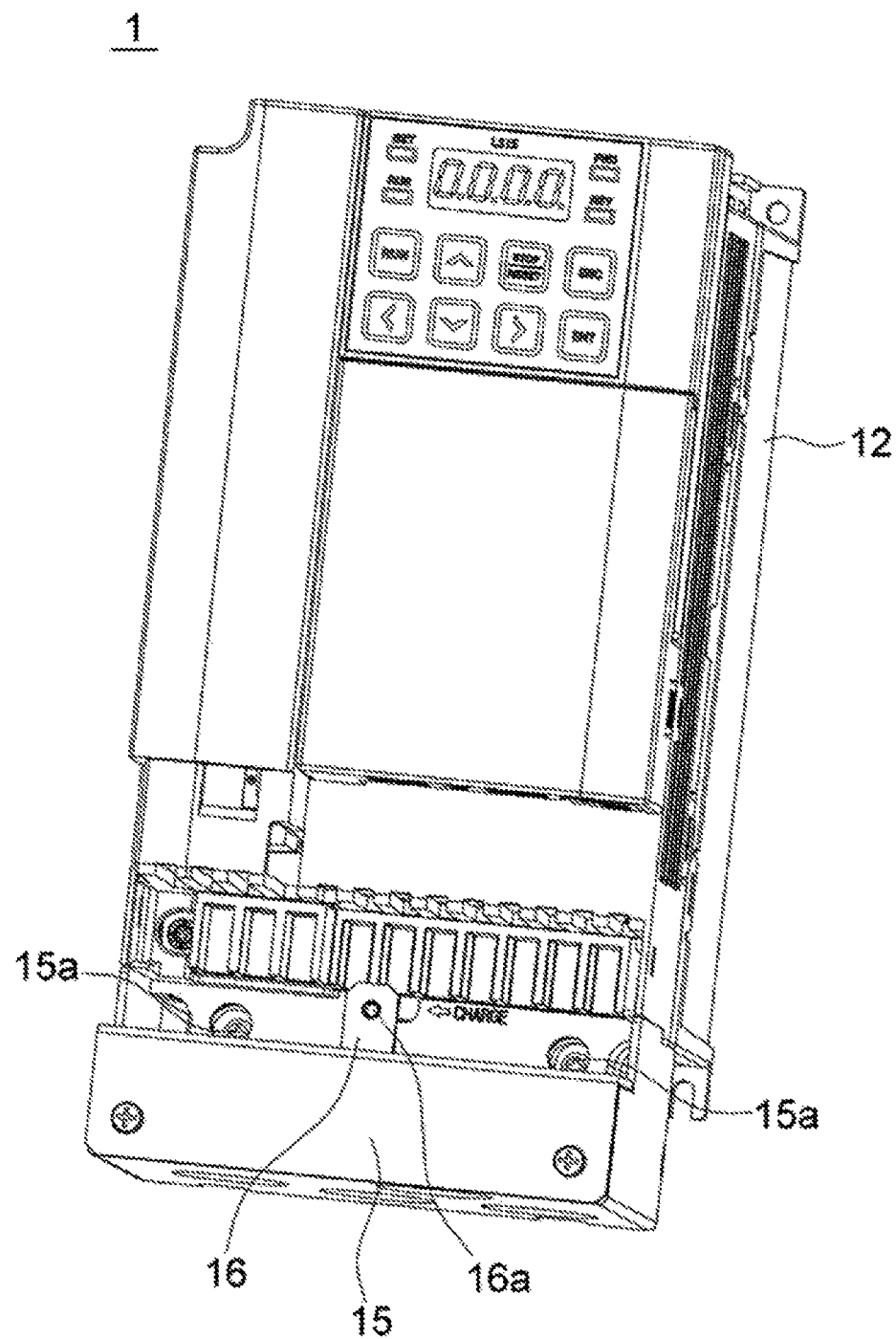
FIG. 2 shows a state in which an IO cover is removed in FIG. 1.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Figure 3:
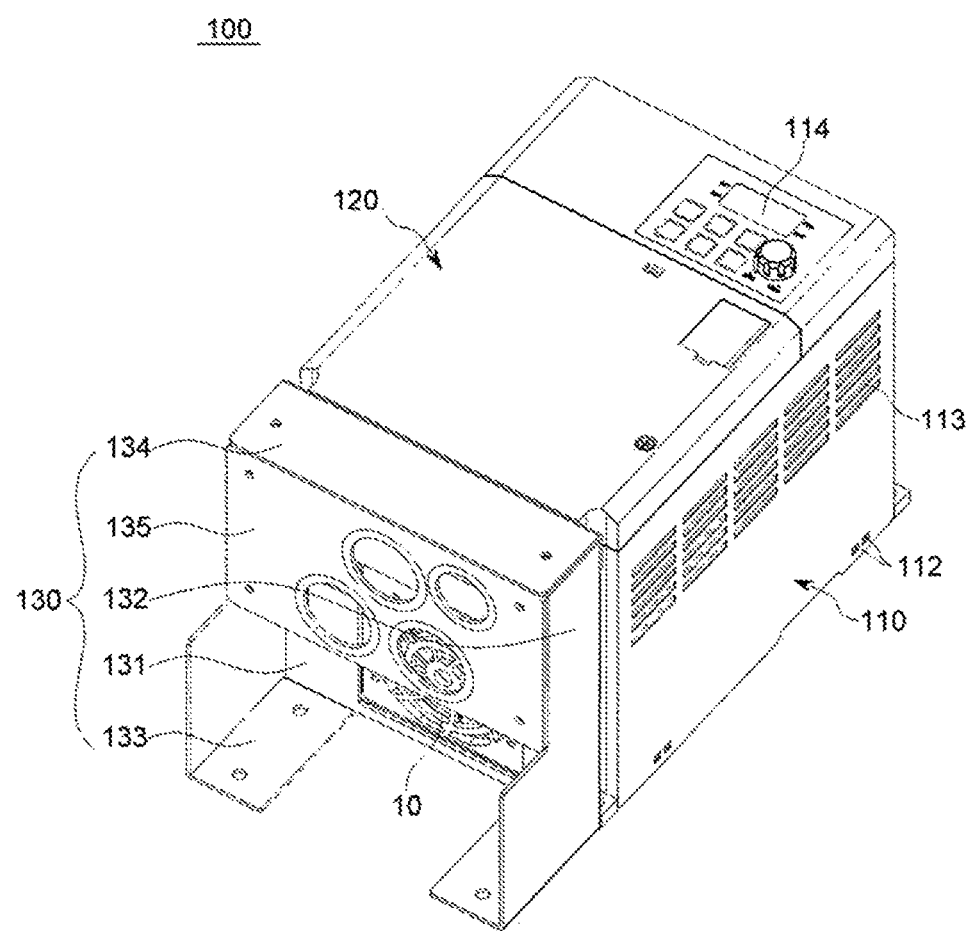
FIG. 3 is a perspective view of a device for driving a motor according to one embodiment of the present disclosure.
Figure 4:
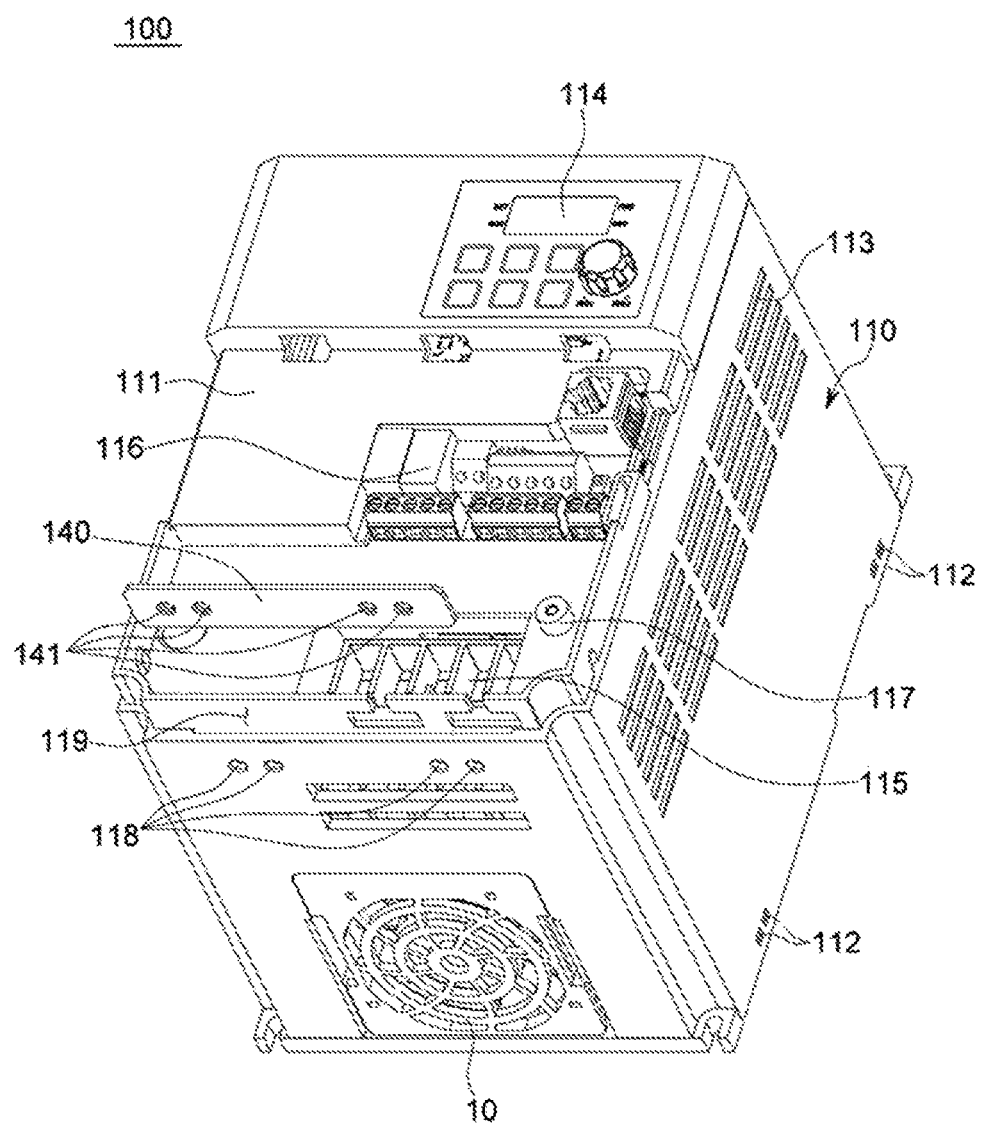
FIG. 4 shows a state in which a strength-enhancing piece is fastened to a main housing in the device for driving a motor according to one embodiment of the present disclosure.
Figure 5:
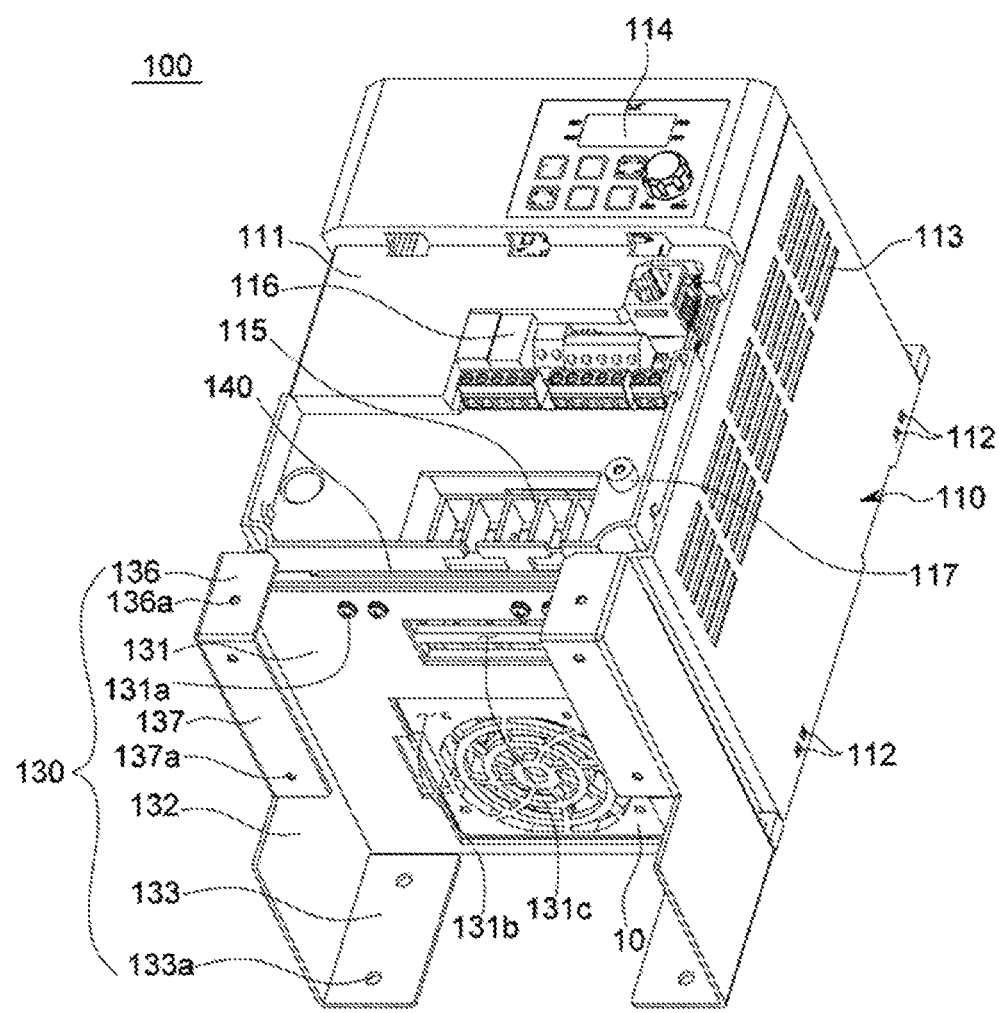
FIG. 5 shows a state in which an auxiliary housing is coupled to a main housing in a device for driving a motor according to one embodiment of the present disclosure.
Figure 6:
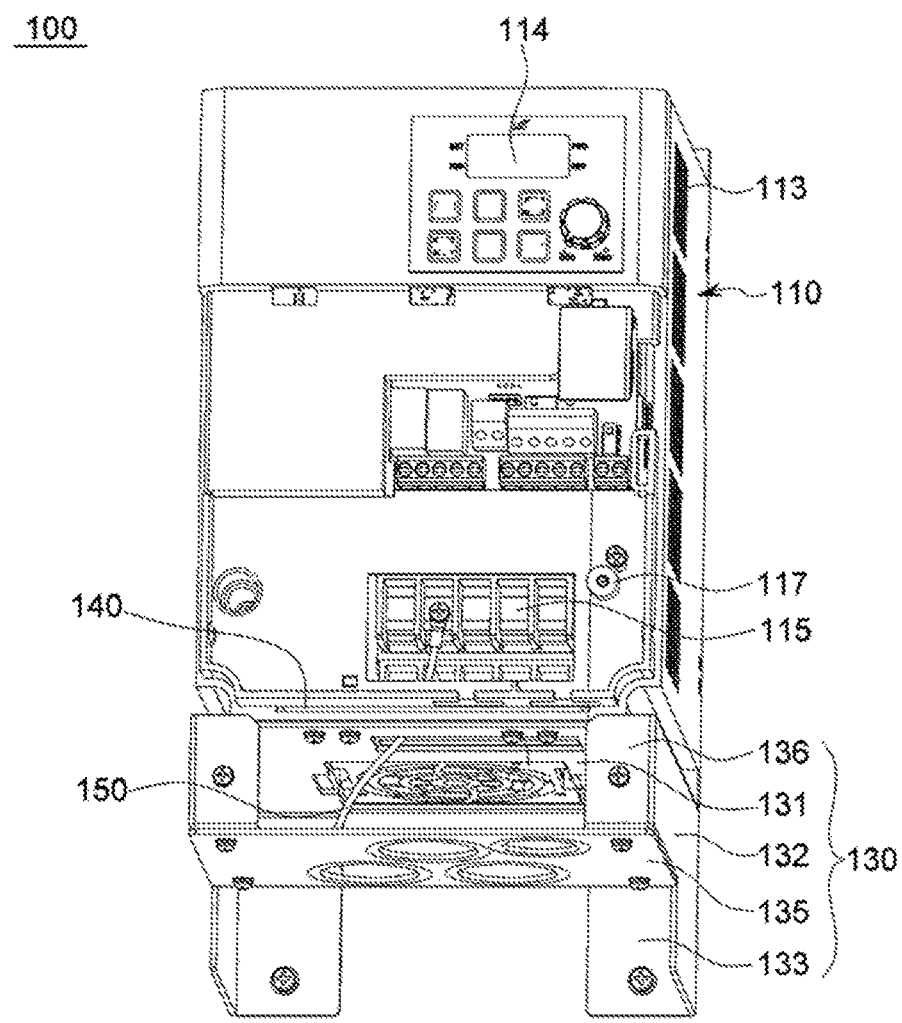
FIG. 6 illustrates a state in which a wire is grounded in a device for driving a motor according to one embodiment of the present disclosure.

FIG. 3 is a perspective view of a device for driving a motor according to one embodiment of the present disclosure. FIG. 4 shows a state in which a strength-enhancing piece is fastened to a main housing in the device for driving a motor according to one embodiment of the present disclosure. FIG. 5 shows a state in which an auxiliary housing is coupled to a main housing in a device for driving a motor according to one embodiment of the present disclosure. FIG. 6 illustrates a state in which a wire is grounded in a device for driving a motor according to one embodiment of the present disclosure.

Referring to FIG. 3 to FIG. 6, a device 100 for driving a motor according to one embodiment of the present disclosure may include a main housing 110, an 10 (input/output) cover 120, and an auxiliary housing 130.

The main housing 110 accommodates a circuit module therein. A portion of the top of the main housing defines an open portion 111.

Specifically, the main housing 110 may be embodied as a hollow cuboid or cube.

Further, the main housing 110 is opened at a bottom thereof to accommodate the heat sink therein. To this end, coupling grooves 112 for coupling with hooks of the heat sink may be defined at a lower end portion of a side face of the main housing 110.

Further, a plurality of vent holes 113 may be defined in a middle or upper region of the side face of the main housing 110 so that heat generated from the internal circuit module may be discharged to an outside or external air may be introduced into the main housing 110.

The top of the main housing 110 has the open portion 111 in one region thereof while a control panel 114 is disposed on the top of the main housing in the other region thereof.

The open portion 111 exposes a terminal slot block 115 and an IO board 116 partially or entirely.

The IO cover 120 may be fastened to the main housing at the open portion 111 thereof. A coupling between the IO cover 120 and the main housing may be a hook based coupling, a bolt based coupling, or the like. In case of the bolt based coupling, at least one IO cover fastening hole 117 may be defined in the main housing 110 at the open portion 111 thereof.

The auxiliary housing 130 may be fastened to the main housing 110 at one side in which the open portion 111 is defined.

Specifically, at least one first coupling holes 118 may be formed in the main housing 110. The auxiliary housing 130 may have at least one second coupling holes 131a defined at positions corresponding to positions of the first coupling holes 118. Corresponding screws or the like may pass through corresponding first and second coupling holes together.

Accordingly, the auxiliary housing 130 may be primarily fastened to the main housing 110 at one side face thereof.

Further, the main housing 110 has a strength-enhancing groove 119 defined in a side face thereof in which the first coupling holes 118 are defined. The main housing 110 further includes a strength-enhancing piece 140 of a size corresponding to a size of the strength-enhancing groove 119. The strength-enhancing piece 140 has third coupling holes 141 defined in positions thereof corresponding to positions of the first coupling holes 118. Corresponding screws or the like may pass through corresponding first coupling holes 118 and third coupling holes 141. In this way, the strength-enhancing groove 119 and the strength-enhancing piece 140 allow the main housing 110 and the auxiliary housing 130 to be more firmly fastened to each other.

In this connection, the auxiliary housing 130 may include a side face portion 131 that engages with the main housing 110, a pair of brackets 132 disposed opposite to each other from both lateral ends of the side face portion 131 respectively, and a bottom portion 133 connected to a bottom end of the pair of brackets 132 and having fourth coupling holes 133*a* defined therein for coupling with other electronic devices.

Thus, the auxiliary housing 130 fastened onto a ground or to a top of another electronic equipment may be securely and secondarily fixed to the main housing.

Further, in order to define a space for receiving an external wire or the like, the auxiliary housing 130 may further include auxiliary caps 134 and 135 which are fastened to the side face portion 131 and the pair of brackets 132.

In this connection, the auxiliary caps 134 and 135 may include a first cap 134 which is parallel to and faces away the bottom portion 133 and is connected to the side face portion 131 of the auxiliary housing 130, and a second cap 135 which is parallel to and faces away the side face portion 131 and is fastened to the pair of brackets 132.

Further, for securing the auxiliary caps 134 and 135, each bracket 132 may include each first inwardly bent portion 136 to engage with the first cap 134; and each second inwardly bent portion 137 to be engaged with the second cap 135.

That is, the first inwardly bent portion 136 and the second inwardly bent portion 137 may have coupling holes 136*a* and 137*a* defined therein for coupling with the first cap 134 and the second cap 135, respectively. Further, the first cap 134 and the second cap 135 together forms a inverse L shape in an integral or separate manner.

Further, the auxiliary housing 130 may be made of a durable metal material and may be firmly fixed in lateral directions. In this case, the terminal slot block 115 is disposed in the open portion 111 of the main housing 110. One end of the ground wire 150 may be connected to the terminal slot block 115 and the other end thereof may be connected to the auxiliary housing 130.

Further, the side face portion 131 has a first open face 131*b* defined therein for exposing a cooling fan 10 disposed in the main housing 110. The side face portion 131 has a second open face 131*c* defined therein through which the ground wire 150, which will be described later passes from the main housing 110 toward the auxiliary housing 130.

This arrangement of the ground wire 150 may eventually increase the convenience of the user.

In short, the present disclosure is advantageous in that the main housing 110 is made of a non-metallic material, thereby reducing the manufacturing cost and reducing the volume and compacting the design of the product. Since the auxiliary housing 130 is firmly fixed to the main housing at two locations, the auxiliary housing 130 made of a metal may have improved the durability and a grounding thereto may be achieved.

Although the embodiments according to the present disclosure have been described above, they are merely illustrative. It will be understood by those skilled in the art that various changes and modifications may be made without departing from the scope of the present invention. Therefore, the true scope of technical protection of the present disclosure should be determined by the following claims.

What is claimed is:

1. A device for driving a motor, the device comprising: a main housing configured to accommodate a circuit module therein, wherein a top of the main housing is partially opened to define an open portion; an input/output (IO) cover coupled to the main housing so as to occupy the open portion; and an auxiliary housing coupled to the main housing at an vertical side face of the main housing, wherein the auxiliary housing includes:
   a side face portion engaging with the vertical side face of the main housing;
   a pair of brackets extending from both lateral ends of the side face portion respectively in a perpendicular manner to the side face portion;
   bottom portions connected to bottom ends of the pair of brackets, wherein each of the bottom portions has at least one fourth coupling hole defined therein; and
   an auxiliary cap structure coupled to the pair of brackets.

2. The device of claim 1, wherein the main housing further accommodates a heat sink therein.

3. The device of claim 2, wherein the main housing has a coupling groove defined in a lower end of another vertical side face of the main housing, wherein the coupling groove is coupled with a hook of the heat sink,
   wherein the main housing has a plurality of vent holes defined in the another vertical side face of the main housing for inflow and outflow of air therethrough.

4. The device of claim 1, wherein at least one first coupling hole is defined in the vertical side face of the main housing,
   wherein the auxiliary housing has at least one second coupling hole a defined at a position corresponding to a position of the at least one first coupling hole.

5. The device of claim 4, wherein the main housing has a strength-enhancing vertical groove upwardly opened and defined in the vertical side face,
   wherein the main housing further includes a strength-enhancing piece of a shape corresponding to a shape of the strength-enhancing groove,
   wherein the strength-enhancing piece has at least one third coupling hole defined in a position thereof corresponding to the position of the at least one first coupling hole.

6. The device of claim 1, wherein the auxiliary cap structure includes: a horizontal cap facing away the bottom portions and coupled to a top of the auxiliary housing; and a vertical cap facing away the side face portion and coupled to the pair of brackets.

7. The device of claim 6, wherein each of the brackets includes:
   an inwardly bent horizontal portion to be coupled to the horizontal cap; and
   an inwardly bent vertical portion to be coupled to the vertical cap.

8. The device of claim 1, wherein the main housing accommodates therein a terminal slot block under the open portion of the main housing, wherein one end of a ground wire is connected to the terminal slot block and another end thereof is connected to the auxiliary housing.

\* \* \* \* \*